(12) United States Patent
Wu et al.

(10) Patent No.: US 9,812,460 B1
(45) Date of Patent: Nov. 7, 2017

(54) NVM MEMORY HKMG INTEGRATION TECHNOLOGY

(71) Applicant: Taiwan Semiconductor Manufacturing Co., Ltd., Hsin-Chu (TW)

(72) Inventors: Wei Cheng Wu, Zhubei (TW); Chien-Hung Chang, Taipei (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 15/162,761

(22) Filed: May 24, 2016

(51) Int. Cl.
*H01L 21/3205* (2006.01)
*H01L 21/4763* (2006.01)
*H01L 27/11521* (2017.01)
*H01L 27/11526* (2017.01)
*H01L 29/78* (2006.01)
*H01L 29/66* (2006.01)

(52) U.S. Cl.
CPC .. *H01L 27/11521* (2013.01); *H01L 27/11526* (2013.01); *H01L 29/6656* (2013.01); *H01L 29/66825* (2013.01); *H01L 29/7831* (2013.01)

(58) Field of Classification Search
CPC ......... H01L 27/11558; H01L 29/42328; H01L 29/42344; H01L 21/823456
USPC ......... 257/316, 319, 334; 438/258, 587, 588
See application file for complete search history.

(56) References Cited

U.S. PATENT DOCUMENTS

| | | | |
|---|---|---|---|
| 8,524,557 B1 * | 9/2013 | Hall | H01L 29/66833 257/E21.662 |
| 8,877,568 B2 * | 11/2014 | Shroff | H01L 21/28273 257/E21.423 |
| 2005/0142755 A1 * | 6/2005 | Han | H01L 27/105 438/258 |

* cited by examiner

*Primary Examiner* — Sonya D McCall Shepard
(74) *Attorney, Agent, or Firm* — Eschweiler & Potashnik, LLC

(57) ABSTRACT

The present disclosure relates to an integrated circuit (IC) that includes a HKMG hybrid non-volatile memory (NVM) device and that provides small scale and high performance, and a method of formation. In some embodiments, the integrated circuit includes a memory region having a NVM device with a pair of control gate electrodes separated from a substrate by corresponding floating gates. A pair of select gate electrodes are disposed at opposite sides of the pair of control gate electrodes comprise polysilicon. A logic region is disposed adjacent to the memory region and has a logic device with a metal gate electrode disposed over a logic gate dielectric and having bottom and sidewall surfaces covered by a high-k gate dielectric layer.

20 Claims, 8 Drawing Sheets

NVM MEMORY HKMG INTEGRATION TECHNOLOGY

BACKGROUND

Embedded memory is a technology that is used in the semiconductor industry to improve performance of an integrated circuit (IC). Embedded memory is a non-stand-alone memory, which is integrated on the same chip with a logic core and which supports the logic core to accomplish an intended function. High-performance embedded memory enables high-speed and wide bus-width capability, which limits or eliminates inter-chip communication.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
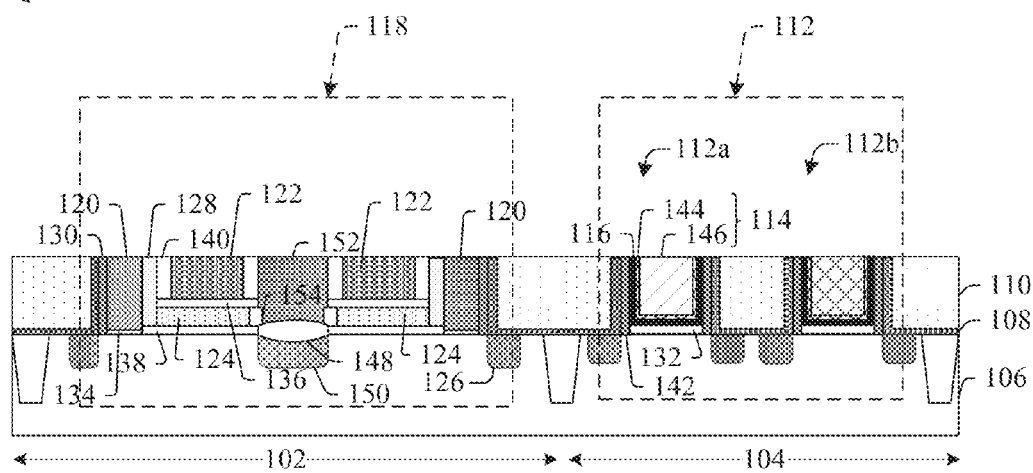
FIG. 1 illustrates a cross-sectional view of some embodiments of an integrated circuit (IC) comprising a hybrid non-volatile memory (NVM) device.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In emerging technology nodes, the semiconductor industry has begun to integrate logic devices and memory devices on a single semiconductor chip. This integration improves performance over solutions where two separate chips—one for memory and another for logic—cause undesirable delays due to wires or leads that connect the two chips. In addition, the processing costs for integrating memory and logic devices on the same semiconductor chip are reduced due to the sharing of specific process steps used to fabricate both types of devices. One common type of embedded memory is embedded flash memory, which may include an array of flash memory cells. A flash memory cell comprises a floating gate electrically insulated by an insulation dielectric. A control gate of the flash memory cell is separated from a channel region within the substrate by the floating gate.

High-k metal gate (HKMG) technology has also become one of the front-runners for the next generation of CMOS devices. HKMG technology incorporates a high-k dielectric to increase transistor capacitance and reduce gate leakage. A metal gate electrode is used to help with Fermi-level pinning and to allow the gate to be adjusted to low threshold voltages. By combining the metal gate electrode and the high-k dielectric, HKMG technology makes further scaling possible and allows integrated chips to function with reduced power.

The present disclosure relates to an integrated circuit (IC) that comprises a small scale and high performance non-volatile memory (NVM) device integrated with a high-k metal gate (HKMG) logic device, and a method of formation. In some embodiments, the integrated circuit comprises a memory region and an adjacent logic region disposed over a substrate. The logic region comprises a logic device including a metal gate electrode having bottom and sidewall surfaces covered by a high-k gate dielectric layer and disposed over a logic gate dielectric, and the memory region comprises a non-volatile memory (NVM) device including a pair of control gate electrodes separated from the substrate by corresponding floating gates. A pair of select gate electrodes are disposed at opposite sides of the pair of control gate electrodes and separated from the substrate by a select gate dielectric. In some embodiments, the select gate electrodes and the control gate electrodes comprise a different material (e.g., polysilicon) from the metal gate electrode of the logic device. By integrating of the HKMG logic device and the NVM memory region, manufacturing processes are simplified such that further scaling becomes possible in emerging technology nodes (e.g., 28 nm and below).

FIG. 1 illustrates a cross-sectional view of some embodiments of an IC 100 comprising a hybrid NVM device (e.g., a semiconductor memory device integrated with a HKMG logic device). The IC 100 comprises a memory region 102 and a logic region 104 disposed adjacent to the memory region 102. The logic region 104 comprises a logic device 112, which includes transistors 112a, 112b disposed over a substrate 106. The logic device 112 (e.g. the transistors 112a, 112b) comprises a metal gate electrode 114 having its bottom and sidewall surfaces covered a high-k gate dielectric layer 116. The metal gate electrode 114 and the high-k gate dielectric layer 116 may be disposed over a logic gate dielectric 132. By making use of HKMG structure in transistors of the logic device 112, transistor capacitance (and thereby drive current) is increased and gate leakage and threshold voltage are reduced.

The memory region 102 comprises a non-volatile memory (NVM) device 118 including a pair of control gate electrodes 122 separated from the substrate 106 by corresponding floating gates 124. The floating gates 124 are disposed on a floating gate dielectric 138 and have upper surfaces covered by an inter-poly dielectric 136. In some embodiments, a control gate spacer 140 can be disposed on the inter-poly dielectric 136 and along sidewalls of the pair of control gate electrodes 122. A floating gate spacer 128 can be disposed on the floating gate dielectric 138 and along outer sidewalls of the pair of the floating gates 124. In some embodiments, the floating gate spacer 128 may comprise one or more layers of oxide or nitride. For example, the floating gate spacer 128 may include a multi-layer structure such as an ONO structure having two oxide layers sandwiching a nitride layer, or a NON structure having two nitride layers sandwiching a oxide layer. In some embodiments, a pair of select gate electrodes 120 are disposed at opposite sides of the pair of control gate electrodes 122 and separated from the substrate 106 by a select gate dielectric 134. The floating gate dielectric 138 and the inter-poly dielectric 136 have thicknesses greater than a thickness of the select gate dielectric 134. In some embodiments, the control gate electrodes 122 and the select gate electrodes 120 have cuboid shapes, which have planar upper surfaces aligned with an upper surface of the metal gate electrode 114. An erase gate electrode 152 can be disposed between inner sides of the pair of the floating gates 124 on a common source/drain dielectric 148 and separated from the floating gates 124 by a tunneling dielectric layer 154. The erase gate electrode 152 may have a planar upper surface coplanar with an upper surface of the control gate electrode 122 and the metal gate electrode 114.

In some embodiments, the select gate electrode 120 and the control gate electrode 122 comprise a different material than the metal gate electrode 114. For example, in some embodiments, the select gate electrode 120 and the control gate electrode 122 may comprise doped polysilicon. Source/drain regions 126 are arranged alongside the select gate spacer 130. A common source/drain region 150 can be disposed under the common source/drain dielectric 148. In some embodiments, the select gate electrode 120 may be connected to a word line, which is configured to control access of the NVM device 118. During operation, charges (e.g. electrons) can be trapped in the floating gate 124, setting a NVM memory cell to one logic state (e.g. logical "0"), and can be removed from the floating gate 124 by the erase gate electrode 152 to change the NVM memory cell to another logic state (e.g. logical "1").

In some embodiments, a select gate spacer 130 is disposed on an upper surface of the substrate 106 and along outer sidewalls of the pair of the select gate electrodes 120. A sidewall spacer 142 is disposed along sidewalls of the metal gate electrode 114 and the logic gate dielectric 132. In some embodiments, the select gate spacer 130 and the sidewall spacer 142 can be made of silicon nitride or silicon oxide. The select gate spacer 130 and the sidewall spacer 142 may have upper surfaces that are aligned with upper surfaces of the metal gate electrode 114, the select gate electrode 120, and the control gate electrode 122. The logic region 104 and the memory region 102 may be laterally separated from one another by an inter-layer dielectric layer 110 arranged over the substrate 106. In some embodiments, the inter-layer dielectric layer 110 may comprise a low-k dielectric layer, an ultra low-k dielectric layer, an extreme low-k dielectric layer, and/or a silicon dioxide layer. Though not shown in FIG. 1, in some embodiments, one or more of the plurality of contacts may extend through the inter-layer dielectric layer 110 and be coupled to the source/drain regions 126. In some embodiments, the plurality of contacts may comprise a metal such as tungsten, copper, and/or aluminum.

In some embodiments, a contact etch stop layer 108 separates the inter-layer dielectric layer 110 from the logic device 112, the NVM device 118 and the substrate 106. The contact etch stop layer 108 may have a 'U' shaped structure and line the logic device 112, the NVM device 118 and an upper surface of the substrate 106. The contact etch stop layer 108 may comprise a planar lateral component connecting a first vertical component abutting the select gate spacer 130 arranged along a side of the NVM device 118 and a second vertical component abutting the sidewall spacer 142 arranged along a side of the logic device 112. Using the inter-layer dielectric layer 110 and the contact etch stop layer 108 to isolate the logic device 112 and the NVM device 118 allows for high device density to be achieved.

Logic devices 112 (e.g. the transistors 112*a*, 112*b*) of the logic region 104 may comprise metal gate electrodes with different compositions and thicknesses. For example, the logic region 104 may comprise an NMOS transistor device having an NMOS metal gate and a PMOS transistor device having a PMOS metal gate. The NMOS metal gate has a different composition and a different work function than the PMOS metal gate. The metal gate electrodes may comprise a core metal 146 separated from the high-k gate dielectric layer 116 by a barrier layer 144. In some embodiments, the core metal 146 may comprise copper (Cu), tungsten (W) or aluminum (Al), for example. The barrier layer 144 can comprises metals such as titanium (Ti), tantalum (Ta), zirconium (Zr), or their alloys, for example. In some embodiments, the high-k gate dielectric layer 116 may comprise hafnium oxide (HfO), hafnium silicon oxide (HfSiO), hafnium aluminum oxide (HfAlO), or hafnium tantalum oxide (HMO), for example.

FIGS. 2-14 illustrate a series of cross-sectional views 200-1400 of some embodiments of a method for manufacturing an IC comprising a hybrid NVM device.

Figure 2:
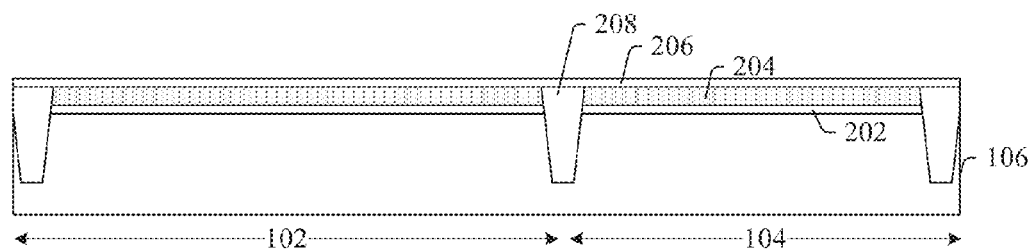
FIGS. 2-14 illustrate a series of cross-sectional views of some embodiments of a method for manufacturing an IC comprising a hybrid NVM device.

As shown in cross-sectional view 200 of FIG. 2, a floating gate dielectric layer 202 and a floating gate layer 204 are formed over the substrate 106 within a memory region 102 and a logic region 104. In some embodiments, the memory region 102 and the logic region 104 are separated by an isolation structure 208. In some embodiments, the isolation structure 208 comprises a deep trench disposed within the substrate 106 and filled with a dielectric material. The isolation structure 208 may have an upper surface that is coplanar with an upper surface of the floating gate layer 204, as a result of a planarization process. In some embodiments, the floating gate dielectric layer 202 comprises silicon dioxide and the floating gate layer 204 comprises doped polysilicon. An inter-poly dielectric layer 206 is then formed over the floating gate layer 204 and the isolation structure 208. In various embodiments, the substrate 106 may comprise any type of semiconductor body (e.g., silicon bulk, SiGe, SOI, etc.) such as a semiconductor wafer or one or more die on a wafer, as well as any other type of semiconductor and/or epitaxial layers formed thereon and/or otherwise associated therewith. In some embodiments, the floating gate dielectric layer 202, the floating gate layer 204 and the inter-poly dielectric layer 206 are formed by using a deposition technique (e.g., PVD, CVD, PE-CVD, ALD, etc.).

Figure 3:
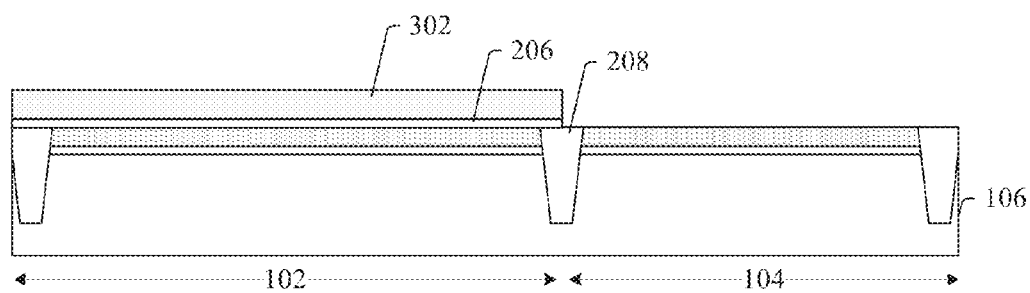

As shown in cross-sectional view 300 of FIG. 3, the inter-poly dielectric layer 206 is patterned so that it remains within the memory region 102 and so that it is removed from the logic region 104. In some embodiments, the inter-poly dielectric layer 206 is removed by performing a photolithography process that patterns a photosensitive masking layer (e.g., a photoresist mask 302) to protect the inter-poly dielectric layer 206 at the memory region 102 from removal by one or more subsequent etching processes. In various embodiments, the etching processes may comprise a wet etch and/or a dry etch (e.g., a plasma etch with tetrafluoromethane ($CF_4$), sulfur hexafluoride ($SF_6$), nitrogen trifluoride ($NF_3$), etc.).

Figure 4:
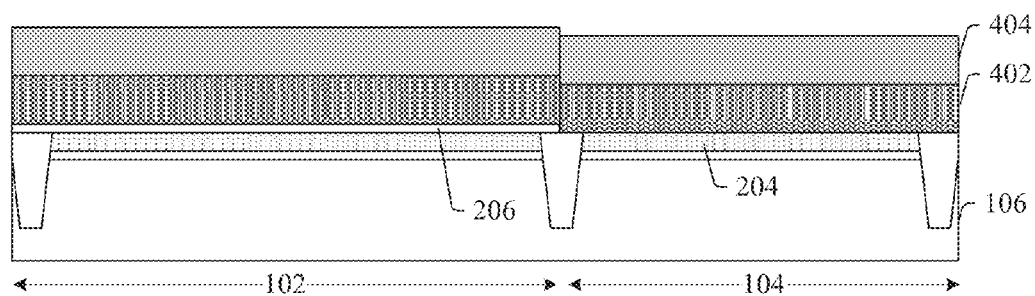

As shown in cross-sectional view 400 of FIG. 4, a control gate layer 402 and a hard mask layer 404 are subsequently formed. Though not shown in FIG. 4, in some alternative embodiments, a planarization process can be performed on the control gate layer 402 or the hard mask layer 404, such that the control gate layer 402 and/or the hard mask layer 404 have planar upper surfaces within the memory region 102 and the logic region 104. The control gate layer 402 and the hard mask layer 404 can be formed directly on the inter-poly dielectric layer 206 within the memory region 102 and directly on the floating gate layer 204 within the logic region 104. In some embodiments, the control gate layer 402 may comprise polysilicon or metal formed by a deposition process (e.g., CVD, PVD, ALD, etc.).

Figure 5:
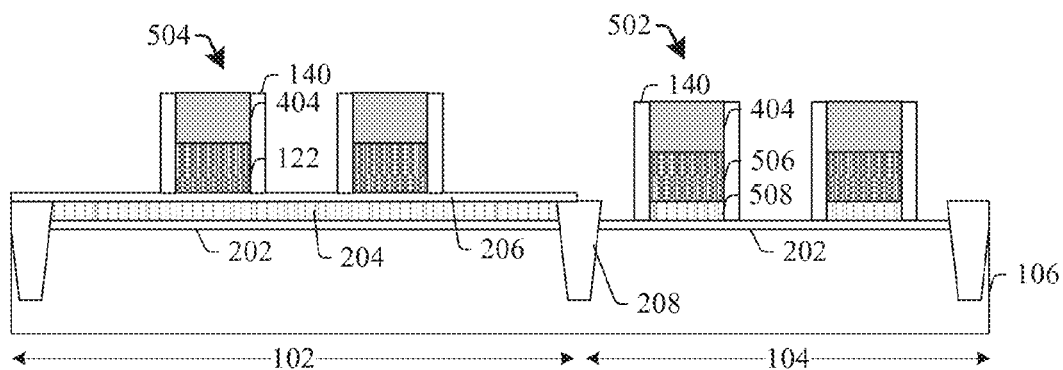

As shown in cross-sectional view 500 of FIG. 5, the hard mask layer 404, the control gate layer 402, and the floating gate layer 204 within the logic region 104 (shown in FIG. 4) are patterned to form a sacrificial logic gate stack 502 within the logic region 104 and a control gate stack 504 within the memory region 102. The sacrificial logic gate stack 502 may comprise a first sacrificial gate material 506, which is a portion of the control gate layer 402 of FIG. 4, and a second sacrificial gate material 508, which is a portion of the floating gate layer 204 of FIG. 4. The first sacrificial gate material 506 and the second sacrificial gate material 508 may be formed under the hard mask layer 404. The control gate stack 504 may comprise a control gate electrode 122, which is a portion of the control gate layer 402 of FIG. 4, formed under the hard mask layer 404 and over the inter-poly dielectric layer 206. In some embodiments, the sacrificial logic gate stack 502 and the control gate stack 504 are formed by performing a photolithography process followed by one or more subsequent etching processes. In various embodiments, the etching processes may comprise a wet etch or a dry etch (e.g., a plasma etch with tetrafluoromethane ($CF_4$), sulfur hexafluoride ($SF_6$), nitrogen trifluoride ($NF_3$), etc.). The etching processes may stop on the inter-poly dielectric layer 206 within the memory region 102, and may stop on the floating gate dielectric layer 202 within the logic region 104. In some embodiments, a control gate spacer 140 is subsequently formed along sidewalls of the sacrificial logic gate stack 502 and the control gate stack 504. In some embodiments, the control gate spacer 140 is formed by depositing a conformal dielectric layer followed by an etch process, to remove a lateral portion of the dielectric layer and to leave a vertical portion along the sidewalls of the sacrificial logic gate stack 502 and the control gate stack 504.

Figure 6:
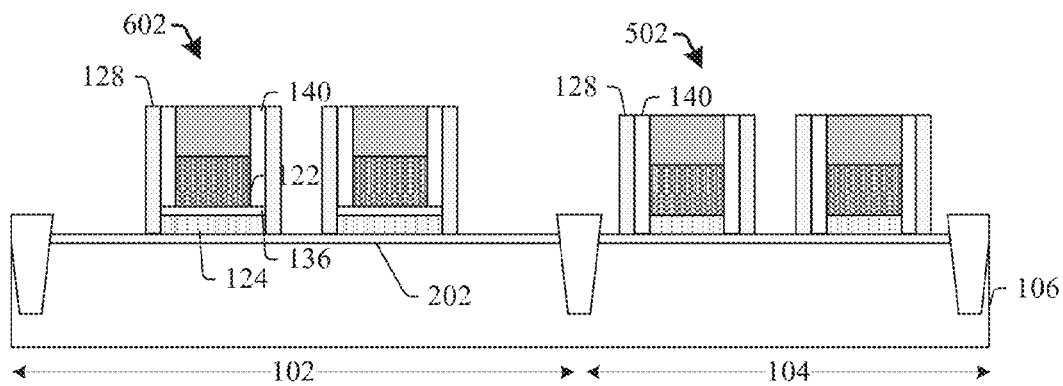

As shown in cross-sectional view 600 of FIG. 6, the inter-poly dielectric layer 206 and the floating gate layer 204 within the memory region 102 are patterned to form a memory gate stack 602 together with the control gate stack 504 (shown in FIG. 5). In some embodiments, the inter-poly dielectric layer 206 and the floating gate layer 204 are patterned self-aligned, i.e., according to the control gate stack 504 and the control gate spacer 140 as a "mask layer". In various embodiments, the etching processes may comprise a wet etch and/or a dry etch (e.g., a plasma etch with tetrafluoromethane ($CF_4$), sulfur hexafluoride ($SF_6$), nitrogen trifluoride ($NF_3$), etc.). The etching processes may stop on the floating gate dielectric layer 202. In some embodiments, a floating gate spacer 128 is subsequently formed along sidewalls of the sacrificial logic gate stack 502 and the memory gate stack 602. In some embodiments, the floating gate spacer 128 may comprise one or more layers of oxide or nitride.

Figure 7:
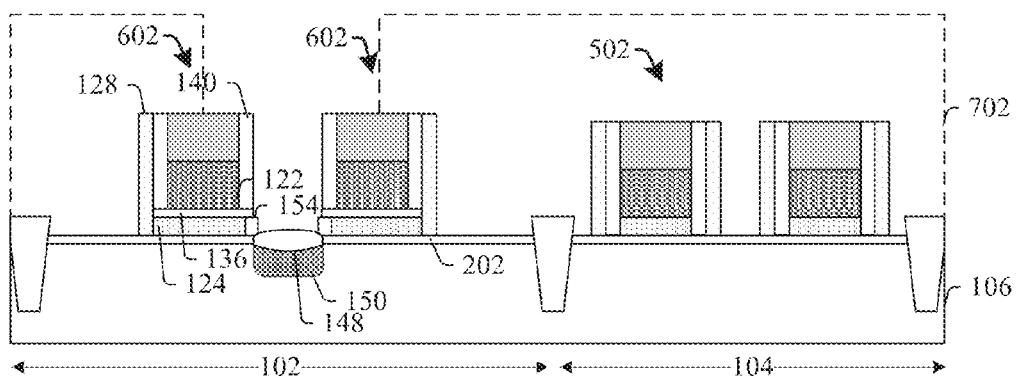

As shown in cross-sectional view 700 of FIG. 7, a common source/drain region 150 is formed between opposing sides of the memory gate stacks 602 within the substrate 106. A portion of the floating gate spacer 128 between the opposing sides of the memory gate stacks 602 is removed with a mask 702 (e.g., a photoresist mask) in place, and a tunneling dielectric layer 154 is formed along the opposing sides of the floating gates 124. In some embodiments, the tunneling dielectric layer 154 is formed by thermal oxidation, wherein an oxidizing agent is forced to diffuse into the floating gates 124. A common source/drain dielectric 148 can be formed on the common source/drain region 150.

Figure 8:
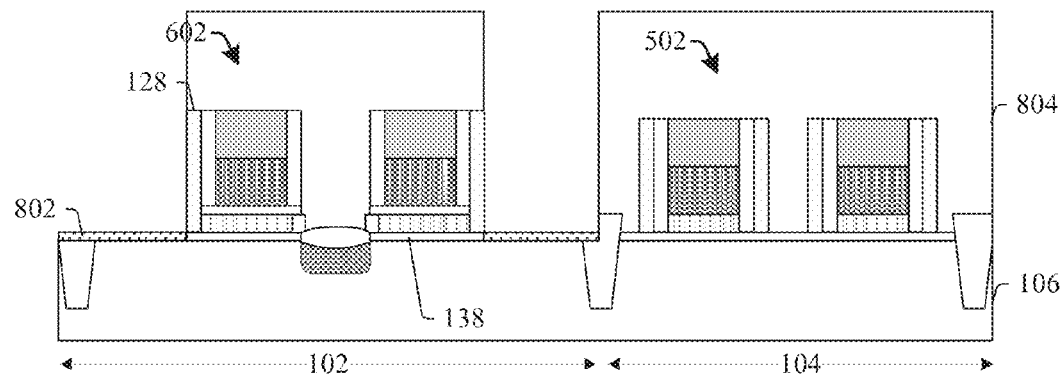

As shown in cross-sectional view 800 of FIG. 8, the floating gate dielectric layer 202 is patterned to form a floating gate dielectric 138 with a mask 804 (e.g., a photoresist mask) in place. A select gate dielectric layer 802 is formed on the substrate 106 aside of the floating gate dielectric 138. In some embodiments, the select gate dielectric layer 802 is formed to have a thickness smaller than that of the floating gate dielectric 138.

Figure 9:
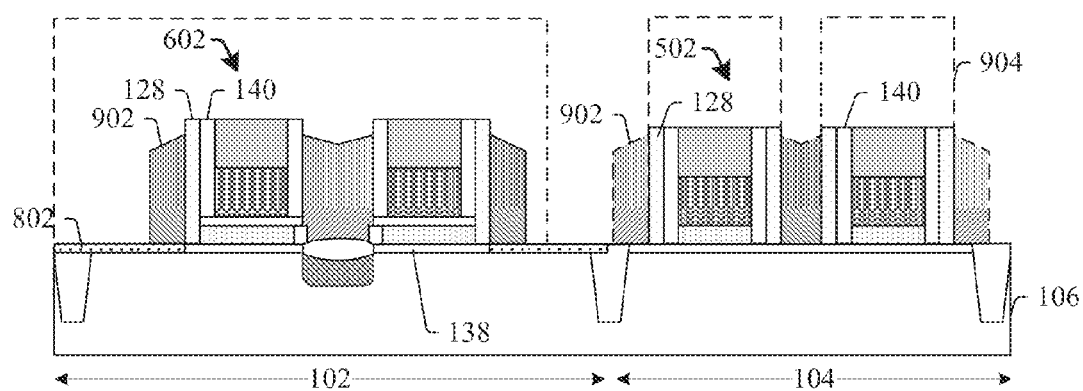

As shown in cross-sectional view 900 of FIG. 9, a conductive layer 902 is formed along sides of the memory gate stacks 602 and the sacrificial logic gate stacks 502. In some embodiments, the conductive layer 902 is formed by depositing the conductive layer conformally over the workpiece before performing an etch process, to remove a lateral portion of the conductive layer and to leave a vertical portion along the sidewalls of memory gate stacks 602 and the sacrificial logic gate stacks 502. Then the conductive layer 902 within the logic region 104 is selectively removed with a mask 904 (e.g., a photoresist mask) in place. Portions of the control gate spacer 140 and the floating gate spacer 128 within the logic region 104 may be also removed.

Figure 10:
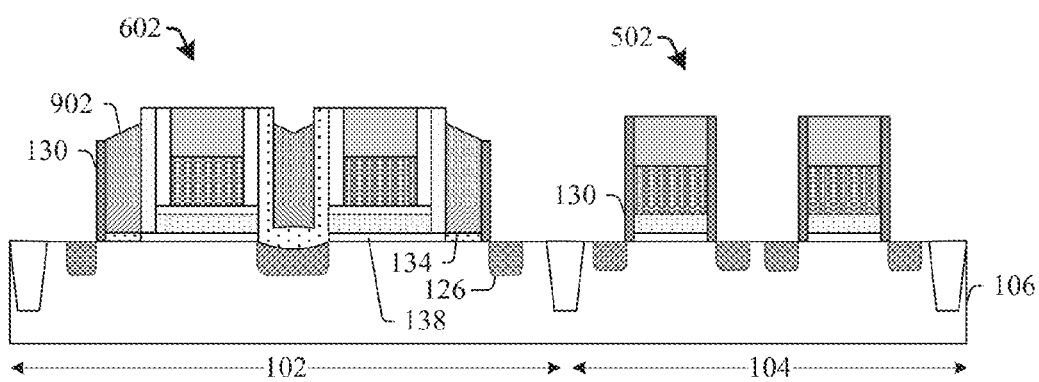

As shown in cross-sectional view 1000 of FIG. 10, a select gate spacer 130 is formed along the conductive layer 902 within the memory region 102 and along the sacrificial logic gate stacks 502 within the logic region 104. In some embodiments, the select gate spacer 130 is formed by depositing a conformal dielectric layer followed by an etch process, to remove a lateral portion of the dielectric layer and to leave a vertical portion along sidewalls of the conductive layer 902 and the sacrificial logic gate stacks 502. In some embodiments, the select gate spacer 130 may comprise an oxide (e.g., $SiO_2$) or a nitride (e.g., SiN) formed by a deposition process. The select gate spacer 130 may be formed directly on an upper surface of the substrate 106. Source/drain regions 126 can subsequently formed within the memory region 102 and within the logic region 104, respectively. In some embodiments, the source/drain regions 126 may be formed by an implantation process that selectively implants the substrate 106 with a dopant, such as boron (B) or phosphorous (P), for example. In some other embodiments, the source/drain regions 126 may be formed by performing an etch process to form a trench followed by an epitaxial growth process. In such embodiments, the source/drain regions 126 may have a raised portion that is higher than the upper surface of the substrate 106. In some embodiments, a salicidation process is performed to form a silicide layer (not shown in the figure) on upper surfaces of the source/drain regions 126. In some embodiments, the salicidation process may be performed by depositing a nickel layer and then performing a thermal annealing process (e.g., a rapid thermal anneal).

Figure 11:
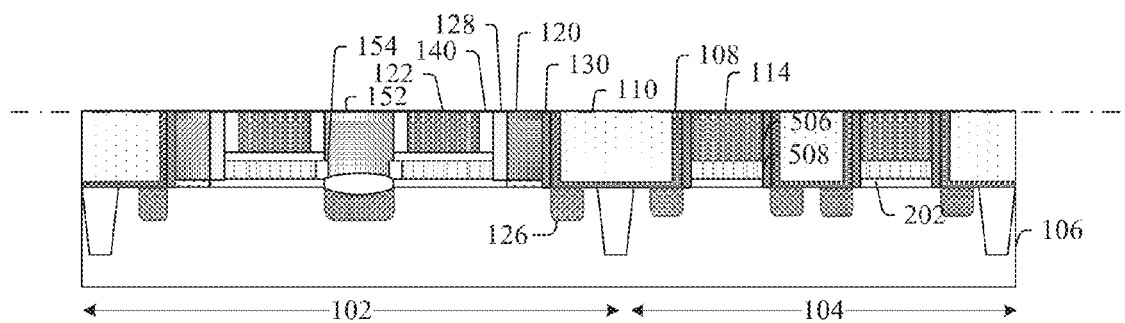

As shown in cross-sectional view 1100 of FIG. 11, a conformal contact etch stop layer 108 is formed over the source/drain regions 126 and extends along the select gate spacer 130. In some embodiments, the contact etch stop layer 108 may comprise silicon nitride formed by way of a deposition process (e.g., CVD, PVD, etc.). A first inter-layer dielectric layer 110 is then formed over the contact etch stop layer 108 followed by performing a first planarization process. In some embodiments, the first planarization process may comprise a chemical mechanical polishing (CMP) process. In some embodiments, the first inter-layer dielectric layer 110 may comprise a low-k dielectric layer, formed by way of a deposition process (e.g., CVD, PVD, etc.). The first sacrificial gate material 506 may be exposed after the first planarization process. An erase gate electrode 152 can be formed between opposing sides of control gate electrodes 122 and select gate electrodes 120 can be formed at opposite sides of the control gate electrodes 122. The erase gate electrode 152 and the select gate electrodes 120 can be made from the conductive layer 902 shown in FIG. 10.

Figure 12:
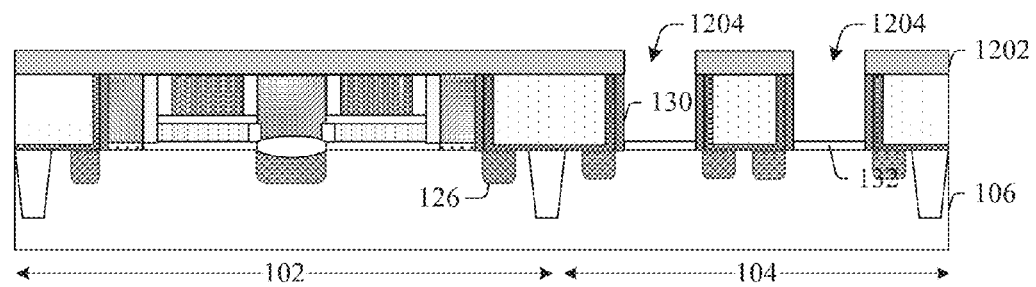

As shown in cross-sectional view 1200 of FIG. 12, a hard mask 1202 is formed to cover the memory region 102 and to expose sacrificial logic gate stacks within the logic region 104. The first sacrificial gate material 506 and the second sacrificial gate material 508 (shown in FIG. 11) are removed, resulting in the formation of trenches 1204 between the select gate spacer 130. In some embodiments, the floating gate dielectric layer 202 within the sacrificial logic gate stacks (shown in FIG. 11) can be removed and replaced by a logic gate dielectric 132.

Figure 13:
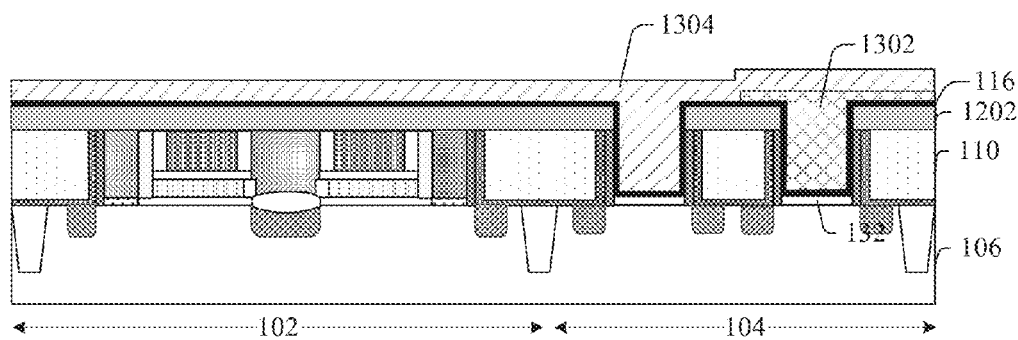

As shown in cross-sectional view 1300 of FIG. 13, a high-k gate dielectric layer 116 and metal gate materials (e.g. 1302, 1304) are formed over the first inter-layer dielectric layer 110 and/or the hard mask 1202 and filled into the trenches 1204 of FIG. 12 through one or more deposition processes (e.g., chemical vapor deposition, physical vapor deposition, etc.). A series of deposition and etching processes can be performed that form different metal compositions within the trenches 1204 for different devices or different components of the same devices, to achieve desired work functions.

Figure 14:
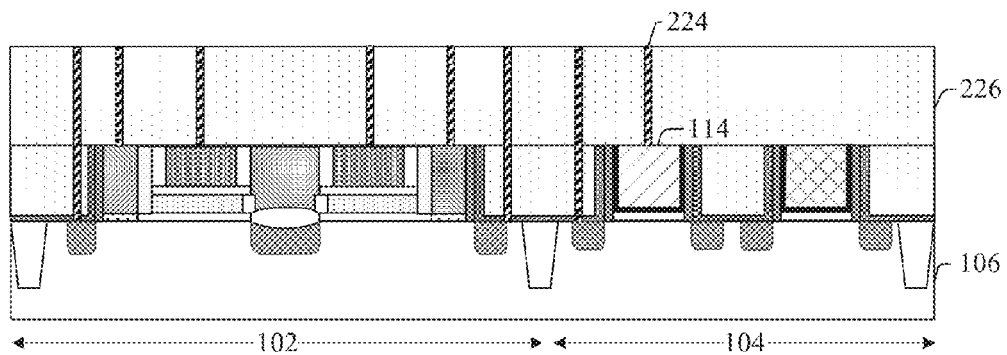

As shown in cross-sectional view 1400 of FIG. 14, a second planarization process may be performed following the deposition processes to form metal gate electrodes 114 on the high-k gate dielectric layer 116. In some embodiments, the metal gate electrodes 114 are formed by forming a core metal and a barrier layer separating the core metal from the high-k gate dielectric layer 116. Contacts 224 are formed within a second inter-layer dielectric layer 226 overlying the first inter-layer dielectric layer 110. The contacts 224 may be formed by selectively etching the second inter-layer dielectric layer 226 to form openings (e.g. with a patterned photoresist mask in place), and by subsequently depositing a conductive material within the openings. In some embodiments, the conductive material may comprise tungsten (W) or titanium nitride (TiN), for example.

Figure 15:
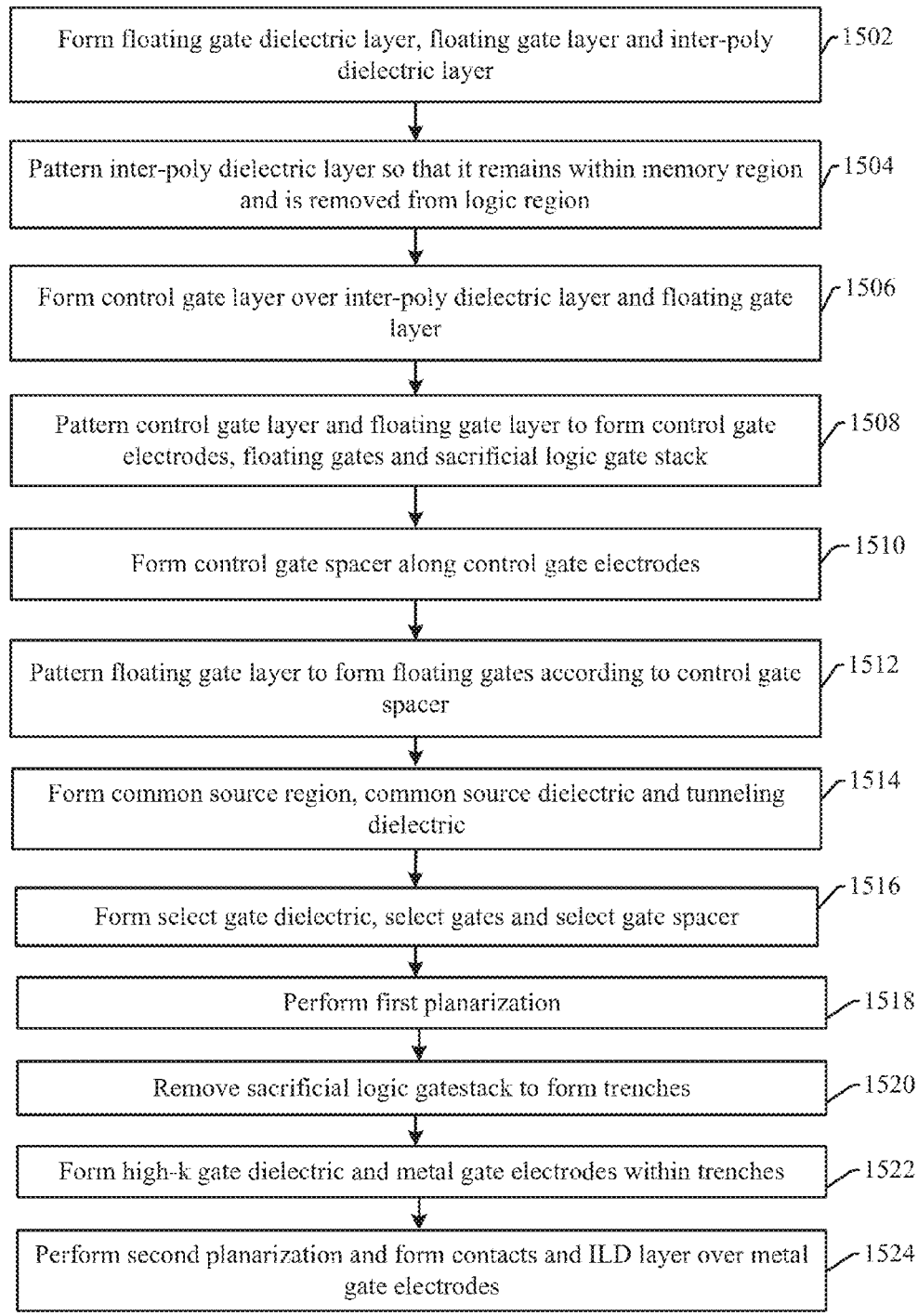
FIG. 15 illustrates a flow diagram of some embodiments of a method for manufacturing an IC comprising a hybrid NVM device.

FIG. 15 illustrates a flow diagram of some embodiments of a method 1500 for manufacturing an IC comprising a hybrid NVM device.

Although method 1500 is described in relation to FIGS. 2-14, it will be appreciated that the method 1500 is not limited to such structures, but instead may stand alone as a method independent of the structures. Furthermore, while the disclosed methods (e.g., method 1500) are illustrated and described herein as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At 1502, a floating gate dielectric layer, a floating gate layer and an inter-poly dielectric layer are formed over a substrate within a memory region and a logic region. FIG. 2 illustrates some embodiments of a cross-sectional view 200 corresponding to act 1502.

At 1504, the inter-poly dielectric layer is patterned so that it remains within the memory region and so that it is removed from the logic region. In some embodiments, the inter-poly dielectric layer is etched to stop on an insolation structure at a peripheral region of the memory region. FIG. 3 illustrates some embodiments of a cross-sectional view 300 corresponding to act 1504.

At 1506, a control gate layer and a hard mask layer are subsequently formed on the remaining inter-poly dielectric layer within the memory region and on the floating gate layer within the logic region. FIG. 4 illustrates some embodiments of a cross-sectional view 400 corresponding to act 1506.

At 1508, the hard mask layer, the control gate layer and the floating gate layer within the logic region are patterned to form a sacrificial logic gate stack. The hard mask layer and the control gate layer within the memory region are patterned to form a control gate stack.

At 1510, a control gate spacer is formed along the sacrificial logic gate stack and the control gate stack. FIG. 5 illustrates some embodiments of a cross-sectional view 500 corresponding to act 1508 and act 1510.

At 1512, the inter-poly dielectric layer and the floating gate layer within the memory region are patterned to form a memory gate stack together with the control gate stack. FIG. 6 illustrates some embodiments of a cross-sectional view 600 corresponding to act 1512.

At 1514, a common source/drain region is formed between opposing sides of the memory gate stacks within the substrate. A common source/drain dielectric and a tunneling dielectric layer are formed on the common source/drain region along the opposing sides of the floating gates. FIG. 7 illustrates some embodiments of a cross-sectional view 700 corresponding to act 1514.

At 1516, a select gate dielectric, select gates and a select gate spacer are subsequently formed at opposite sides of the memory gate stacks. FIGS. 8-10 illustrate some embodiments of cross-sectional views 800, 900 and 1000 corresponding to act 1516.

At 1518, a contact etch stop layer is formed over the substrate, a first inter-level dielectric layer is formed over the contact etch stop layer, and a first planarization is performed. The sacrificial logic gate stacks within the logic region are exposed. FIG. 11 illustrates some embodiments of a cross-sectional view 1100 corresponding to act 1518.

At 1520, the sacrificial logic gate stacks are removed and trenches are formed between the select gate spacer within the logic region. FIG. 12 illustrates some embodiments of a cross-sectional view 1200 corresponding to act 1520.

At 1522, a replacement gate process is subsequently performed by forming a high-k gate dielectric layer and metal materials within the trenches. FIG. 13 illustrates some embodiments of a cross-sectional view 1300 corresponding to act 1522.

At 1524, a second planarization is performed and metal gate electrodes are formed within the logic region. A second inter-level dielectric layer and contacts are formed over the first inter-level dielectric layer. FIG. 14 illustrates some embodiments of a cross-sectional view 1400 corresponding to act 1524.

Therefore, the present disclosure relates to an integrated circuit (IC) that comprises a high-k metal gate (HKMG) hybrid non-volatile memory (NVM) device and that provides small scale and high performance, and a method of formation.

In some embodiments, the present disclosure relates to an integrated circuit. The integrated circuit comprises a memory region comprising a non-volatile memory (NVM) device having a pair of control gate electrodes separated from a substrate by corresponding floating gates. A pair of select gate electrodes are disposed at opposite sides of the pair of control gate electrodes and comprise polysilicon. The integrated circuit further comprises a logic region disposed adjacent to the memory region and comprising a logic device including a metal gate electrode disposed over a logic gate dielectric and having bottom and sidewall surfaces covered by a high-k gate dielectric layer.

In other embodiments, the present disclosure relates to present disclosure relates to a method of forming an integrated circuit. The method comprises providing a substrate comprising a logic region and a memory region and forming and patterning a floating gate layer and a control gate layer to form a pair of stacks of control gate electrodes and floating gates within the memory region and a sacrificial logic gate stack within the logic region. The method further comprises replacing the sacrificial logic gate stack with a high-k dielectric layer and a metal layer to form a metal gate electrode within the logic region.

In yet other embodiments, the present disclosure relates to a method of forming an integrated circuit. The method comprises providing a substrate comprising a logic region and a memory region and forming a floating gate dielectric layer, a floating gate layer and an inter-poly dielectric layer over the substrate. The method further comprises patterning the inter-poly dielectric layer so that it remains within the memory region and so that it is removed from the logic region and forming a control gate layer over the inter-poly dielectric layer and the floating gate layer. The method further comprises patterning the control gate layer and the floating gate layer to form a pair of memory gate stacks of control gate electrodes and floating gates within the memory region and a sacrificial logic gate stack within the logic region. The method further comprises replacing the sacrificial logic gate stack with a high-k dielectric layer and a metal layer to form a metal gate electrode within the logic region.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming an integrated circuit (IC), comprising:
   providing a substrate comprising a memory region and a logic region;
   forming and patterning a floating gate layer and a control gate layer to form a pair of memory gate stacks within the memory region comprising control gate electrodes and floating gates and to form a sacrificial logic gate stack within the logic region;
   replacing the sacrificial logic gate stack with a high-k dielectric layer and a metal layer to form a metal gate electrode within the logic region;
   forming an inter-poly dielectric layer between the floating gate layer and the control gate layer;
   forming a control gate spacer along the control gate electrodes; and
   patterning the inter-poly dielectric layer and the floating gate layer within the memory region according to the control gate spacer to form an inter-poly dielectric and the floating gates.

2. The method of claim 1, further comprising:
   patterning the inter-poly dielectric layer between the floating gate layer and the control gate layer so that it remains within the memory region and so that it is removed from the logic region.

3. The method of claim 1, further comprising:
   forming a floating gate spacer along the control gate spacer and the floating gates; and
   removing a portion of the floating gate spacer between opposing sides of the memory gate stacks;
   forming a tunneling dielectric layer along the opposing sides of the floating gates; and
   patterning a floating gate dielectric layer according to the floating gate spacer to form a floating gate dielectric.

4. The method of claim 1, further comprising:
   forming a pair of select gate electrodes at opposite sides of the pair of the memory gate stacks; and
   forming a select gate spacer alongside the select gate electrodes and the sacrificial logic gate; and
   forming a contact etch stop layer having a 'U' shaped structure including vertical components abutting the select gate spacer and connected by a planar lateral component formed along an upper surface of the substrate.

5. The method of claim 1, wherein the floating gate layer and the control gate layer are polysilicon layers.

6. The method of claim 4, further comprising:
   forming an inter-layer dielectric layer on the contact etch stop layer;
   performing a planarization on the inter-layer dielectric layer to expose the sacrificial logic gate stack;
   performing an etch to remove the sacrificial logic gate stack, leaving trenches between the select gate spacers; and
   filling the high-k dielectric layer and the metal layer within the trenches to form the metal gate electrode within the logic region.

7. A method of forming an integrated circuit (IC), comprising:
   providing a substrate comprising a logic region and a memory region;
   forming a floating gate dielectric layer, a floating gate layer and an inter-poly dielectric layer over the substrate;
   patterning the inter-poly dielectric layer so that it remains within the memory region and so that it is removed from the logic region;

forming a control gate layer over the inter-poly dielectric layer and the floating gate layer;

patterning the control gate layer and the floating gate layer to form a pair of memory gate stacks of control gate electrodes and floating gates within the memory region and to form a sacrificial logic gate stack within the logic region; and replacing the sacrificial logic gate stack with a high-k dielectric layer and a metal layer to form a metal gate electrode within the logic region;

wherein the sacrificial logic gate stack is formed by patterning the control gate layer and the floating gate layer within the logic region.

8. The method of claim 7, further comprising:

forming a control gate spacer along the control gate electrodes; and patterning the floating gate layer and the inter-poly dielectric layer within the memory region according to the control gate spacer to form the floating gates and an inter-poly dielectric between the control gate electrodes and the floating gates.

9. The method of claim 7, further comprising:

forming a pair of select gate electrodes at opposite sides of the pair of the memory gate stacks; and forming an erase gate electrode between opposing sides of the pair of the memory gate stacks;

wherein the select gate electrodes and the erase gate electrode are formed to have upper surfaces aligned with upper surfaces of the control gate electrodes and the metal gate electrode.

10. The method of claim 8, further comprising:

forming a floating gate spacer along the control gate spacer and the floating gates; and forming a common source/drain region between opposing sides of the memory gate stacks within the substrate;

removing a portion of the floating gate spacer between the opposing sides of the memory gate stacks; and forming a common source/drain dielectric on the common source/drain region and a tunneling dielectric layer along the opposing sides of the floating gates.

11. The method of claim 9, further comprising:

forming a select gate spacer alongside the select gate electrodes and the sacrificial logic gate stacks;

forming a contact etch stop layer lining the select gate spacer;

forming an inter-layer dielectric layer on the contact etch stop layer; and performing a planarization on the inter-layer dielectric layer to expose the sacrificial logic gate stack.

12. The method of claim 11, further comprising:

performing an etch to remove the sacrificial logic gate, leaving trenches between the select gate spacers; and filling the high-k dielectric layer and the metal layer within the trenches to form the metal gate electrode within the logic region.

13. A method of forming an integrated circuit (IC), comprising:

providing a substrate comprising a memory region and a logic region;

forming a non-volatile memory (NVM) device within the memory region having a pair of control gate electrodes separated from the substrate by corresponding floating gates;

forming a pair of select gate electrodes at opposite sides of the pair of control gate electrodes using polysilicon;

forming a logic device within the logic region including a metal gate electrode arranged over a logic gate dielectric and having bottom and sidewall surfaces covered by a high-k gate dielectric layer;

forming a control gate spacer along sidewalls of the pair of control gate electrodes;

forming a floating gate spacer along outer sidewalls of the pair of the floating gates and the control gate spacer; and forming a select gate spacer along outer sidewalls of the pair of the select gate electrodes.

14. The method of claim 13, wherein the control gate electrodes and the select gate electrodes are formed to have cuboid shapes, which have planar upper surfaces aligned with an upper surface of the metal gate electrode.

15. The method of claim 13, wherein the floating gates are formed on a floating gate dielectric and have upper surfaces covered by an inter-poly dielectric, wherein the floating gate dielectric and the inter-poly dielectric have thicknesses greater than a thickness of a select gate dielectric under the select gate electrodes.

16. The method of claim 13, further comprising:

forming a contact etch stop layer between the logic region and the memory region with a 'U' shaped structure;

wherein the 'U' shaped structure has a first vertical component abutting the select gate spacer, a second vertical component abutting a sidewall spacer of the logic device and a planar lateral component connecting the first vertical component and the second vertical component.

17. The method of claim 13, wherein an outer sidewall of the control gate spacer is aligned with an outer sidewall of the floating gates.

18. The method of claim 13, wherein the floating gate spacer is formed directly on a floating gate dielectric under the floating gates, and in direct contact with an outer sidewall of the control gate spacer and an outer sidewall of the floating gates.

19. The method of claim 16, further comprising:

forming a common source/drain region between inner sides of the pair of control gate electrodes within the substrate;

forming a common source/drain dielectric on the common source/drain region; and forming an inter-layer dielectric layer on the contact etch stop layer.

20. The method of claim 19, further comprising:

forming an erase gate electrode on the common source/drain dielectric and separated from the pair of floating gates by a tunneling dielectric layer, wherein the erase gate electrode has a planar upper surface aligned with an upper surface of the metal gate electrode.

* * * * *